United States Patent [19]

Komagata

[11] Patent Number: 5,141,830

[45] Date of Patent: Aug. 25, 1992

[54] CHARGED-PARTICLE BEAM LITHOGRAPHY METHOD

[75] Inventor: Tadashi Komagata, Tokyo, Japan

[73] Assignee: Jeol Ltd., Tokyo, Japan

[21] Appl. No.: 807,800

[22] Filed: Dec. 13, 1991

[51] Int. Cl.$^5$ .............................................. G03C 5/00
[52] U.S. Cl. ...................................... 430/30; 430/5; 430/296; 430/942
[58] Field of Search ...................... 430/5, 30, 296, 942

[56] References Cited

U.S. PATENT DOCUMENTS

| | | | |
|---|---|---|---|
| 4,500,789 | 2/1985 | Ban et al. | 430/296 |
| 4,576,884 | 3/1986 | Reisman | 430/296 |
| 4,652,762 | 3/1987 | Ward | 250/492.2 |

FOREIGN PATENT DOCUMENTS 56-40244  4/1981  Japan ................................ 430/296

*Primary Examiner*—Marion E. McCamish
*Assistant Examiner*—Kathleen Duda
*Attorney, Agent, or Firm*—Webb, Burden, Ziesenheim & Webb

[57] ABSTRACT

Method of writing patterns on a substrate, for fabricating masks used in semiconductor fabrication. Thin films are deposited on the substrate. A resist, typically a negative resist, sensitive to an electron beam is applied to the films. The desired patterns are written on the resist with the electron beam. Undesired portions of the films are etched away. The selective removal of the films deforms the substrate. The amount of the deformation is forecasted. The positions at which the electron beam hits the resist are corrected according to the forecasted amount.

3 Claims, 2 Drawing Sheets

PRIOR ART

CHARGED-PARTICLE BEAM LITHOGRAPHY METHOD

"This is a continuation of copending application(s) Ser. No. 07/584,722 filed on Sept. 18, 1990, now abandoned.

FIELD OF THE INVENTION

The present invention relates to a charged-particle beam lithography method adequate to create masks used in semiconductor fabrication, employing an electron beam or ion beam.

BACKGROUND OF THE INVENTION

Masks used in semiconductor fabrication are manufactured by electron-beam lithography. Manufacture of such masks is disclosed in U.S. Pat. No. 4,652,762 and described next by referring to FIG. 1(a) to FIG. 1(f).

First, a glass substrate 1 as shown in FIG. 1(a) is prepared. A thin film 2 which does not transmit light is formed on the substrate 1 by vacuum deposition, as shown in FIG. 1(b). The film 2 is made from chromium (Cr), for example. As the film 2 is deposited, the internal stress and thermal stress in the thin film deform the substrate 1. Then, a resist 3 is applied to the thin film 2, as shown in FIG. 1(c). Thereafter, desired portions of the resist 3 are irradiated with an electron beam EB, as shown in FIG. 1(d). In this example, the parallel lines written by the beam EB are spaced apart from each other by a distance of a. Subsequently, the resist 3 is developed, as shown in FIG. 1(e). If the resist 3 is positive-acting, only the irradiated portions of the resist are removed by the development. After the completion of the development of the resist, only the irradiated portions of the thin film are etched away, as shown in FIG. 1(f). In this condition, most of the substrate 1 is still covered with the thin film 2. Therefore, the deformation of the glass substrate 1 makes little difference with the deformation of the substrate in the condition shown in FIG. 1(b). After the thin film has been removed, belt-like portions are created by the etching. Let b be the distance by which the etched portions are spaced apart from each other. The distance b is different from the distance a but their difference is comparatively small.

Where a negative resist is used, the lithography steps illustrated in FIGS. 1(a)–(d) are carried out also in the case of the positive resist. When the resist is developed, it is removed except for the irradiated portions, as shown in FIG. 2(a). After developing this resist, an etching process is carried out. As a result, only the thin film under the remaining resist portions is left behind; the thin film has been etched away in all the other locations, as shown in FIG. 2(b).

Where a negative resist is employed in this way, only those portions of the thin film which were irradiated with the electron beams are left behind. In this case, the thin film is removed from most of the substrate 1. The substrate that was deformed because of the internal stress in the thin film and other stress then returns to its original condition shown in FIG. 2(b). Consequently, the interval c between the remaining portions of the thin film differs considerably from the interval a between the lines drawn by the electron beam. The result is that the pattern is created with lower accuracy.

SUMMARY OF THE INVENTION

In view of the foregoing problem, it is an object of the present invention to provide a charged-particle beam lithography method of writing patterns without deteriorating the accuracy of fabrication of the patterns if the substrate is deformed by selective removal of thin films.

It is another object of the invention to provide a charged-particle beam lithography method capable of easily and accurately compensating for the deformation of the substrate caused by selective removal of thin films without the need to measure the amount of expansion or contraction of the substrate each time a different type of material is used.

A charged-particle beam lithography method according to the invention involves depositing thin films on a substrate, applying a resist sensitive to a charged-particle beam to the films, writing desired patterns on the resist by the charged-particle beam, and removing the unwanted portions of the thin films according to the written patterns, the improvement in the method being characterized in that the amount of deformation of the substrate caused by the removal is forecasted prior to the writing and that the positions at which the charged-particle beam hits the resist are corrected according to the forecasted amount of deformation.

The degree of deformation of the substrate is forecasted from the patterns to be written. When the patterns are written in practice, the requisite patterns are written with a charged-particle beam at intervals which have been corrected, taking the amount of deformation of the substrate into account.

DETAILED DESCRIPTION OF THE INVENTION

Figure 3:
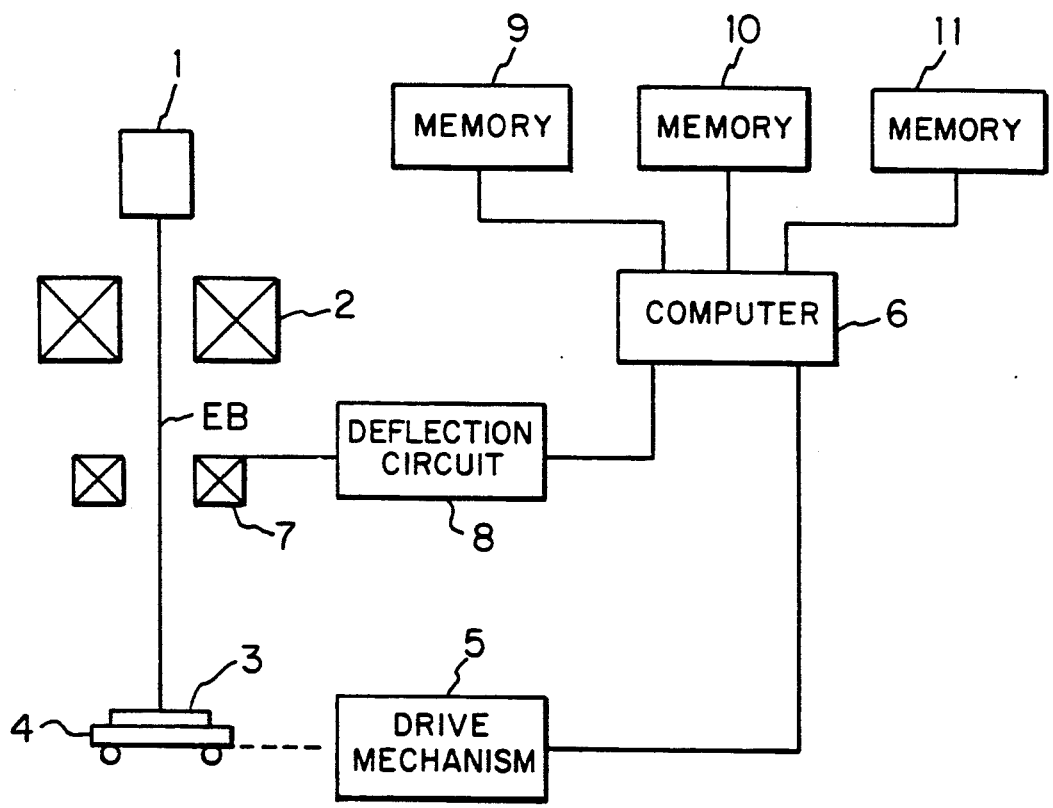
FIG. 3 is a block diagram of an apparatus carrying out the method according to the invention.

Referring to FIG. 3, there is shown an electron beam lithography apparatus for writing a pattern in accordance with the present invention. This apparatus comprises an electron gun 1 producing an electron beam EB, a condenser lens 2 focusing the beam onto a material 3 for writing a pattern upon it, a movable stage 4 carrying the material 3, a drive mechanism 5 driving the stage 4, a computer 6 exerting control over the operation of the drive mechanism 5, a deflector coil 7 for deflecting the electron beam, a deflection circuit 8 connected between the deflection coil 7 and the computer 6, and memories 9, 10, 11 connected with the computer 6. The material 3 has a substrate, thin films over the substrate, and a resist layer over the thin films. The positions at which the beam hits the material 3 are controlled by a deflecting signal supplied to the deflector coil 7 from the deflection circuit 8 under the control of the computer 6. Data about the pattern to be written on the material 3 is stored in the memory 9. Scheduled data including the number of chips lithographically written on the material is stored in the memory 10. The amount of deformation of the substrate of the material 3 is stored in the memory 11 In this example, the memories 9–11 are provided independent of each other. These three memories can also be separate storage areas of a single memory.

In the operation of the apparatus constructed as described above, the amount of deformation of the substrate of the material 3 is forecasted prior to the writing. That is, the degree to which the substrate will be deformed after selective removal of the thin films is forecasted. It is now assumed that n thin films are formed on the substrate. The amount of expansion or contraction of the substrate which is caused by deposition of each thin film is found experimentally in advance. Let $K_1$ be the amount of expansion or contraction of the substrate when the first thin film is deposited. Let $K_j$ be the amount of expansion or contraction of the substrate when the jth thin film is deposited. Let $K_n$ be the amount of expansion or contraction of the substrate when the nth thin film is deposited, and so on. The amount of expansion or contraction of the substrate caused by the deposition of each one of the n thin films on the substrate is measured and stored in the memory 9. That is, the amounts of expansion or contraction $K_1$, $K_2$, . . . , $K_n$ are stored in the memory 9. Each amount of expansion or contraction $K_j$ is determined by the material, the thickness, and the size of the substrate and by the material, the thickness, and other factors of the thin film.

When a pattern is written in practice, the human operator enters various kinds of information into the memory 9, or data is read from the memory 9 to calculate the amount of expansion or contraction of the substrate. These kinds of information include information indicating what kinds of thin films are deposited on the substrate and information indicating whether the resist is positive- or negative-acting. Let A be the ratio of the area of the written resist to the area of the substrate. It is now assumed that the first, the third, and the nth thin films are deposited on the substrate to be written. When the resist is positive-acting, the amount of expansion or contraction of the substrate after etching is given by $$\Delta l = A (K_1 + K_3 + K_n)$$

When the resist is negative-acting, the amount of expansion or contraction of the substrate after etching is given by $$\Delta l = (1-A)(K_1 + K_3 + K_n)$$

Let l be the length or diameter of the substrate. The coefficient of expansion or contraction of the substrate is defined as $$G = \frac{(l + \Delta l)}{l}$$

The aforementioned ratio A is calculated from the data stored in the memory 9 and from the scheduled data stored in the memory 10. The computer 6 calculates the coefficient of expansion or contraction G, using the data indicating the kinds of the thin films actually deposited on the substrate and the data indicating whether the resist is positive- or negative-acting, and stored the computer coefficient in the memory 11. The computer 6 controls the stage drive mechanism 5 and the deflection circuit 8 according to the data about the desired pattern and the scheduled data, to write the desired pattern. It is assumed that the pattern has lengths X1 and Y1 in the X-direction and Y-direction, respectively. The computer 6 performs the following calculations:

$$X1' = X1 \times G$$

$$Y1' = Y1 \times G$$

Figure 1A:
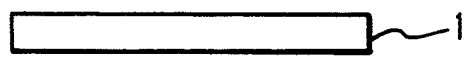
FIGS. 1(a)–1(f) illustrate steps successively performed to write patterns by the prior art techniques.
Figure 1B:
Figure 1C:
Figure 1D:
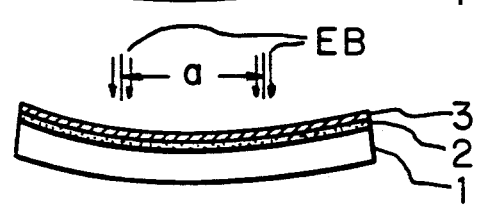
Figure 1E:
Figure 1F:
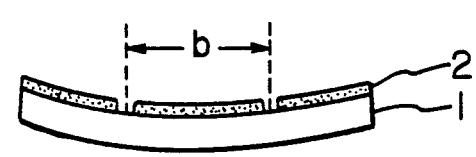
Figure 2A:
FIGS. 2(a)–2(b) illustrate expansion or contraction of the substrate shown in FIGS. 1(a)–(f) illustrative of the prior art caused by selective removal of thin films.
Figure 2B:
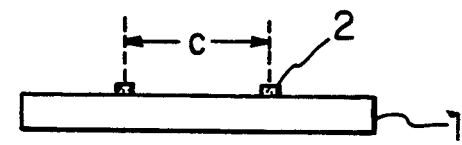

In this way, when a pattern is written in practice, the data about the written pattern is modified according to the expansion or contraction of the material 3 so as to compensate for the loss in the accuracy with which the pattern is manufactured. The deflection circuit 8 and the stage drive mechanism 5 are controlled according to the modified data. As a result, the written pattern may be shorter than the intended length. After the unwanted portions of the thin films are etched away, the substrate is relieved from the expansion or contraction and, therefore, the written portion has the intended length. In the example shown in FIGS. 1 and 2, when patterns are written by the electron beam as shown in FIG. 1(d), the pattern lines are spaced from each other by a distance of a×G. When the condition shown in FIG. 2(b) is reached, the substrate is relieved from the expansion or contraction and so the distance c becomes substantially equal to a.

While a preferred embodiment of the invention has been described using specific terms, such description is for illustrative purposes only, and it is to be understood that changes and variations may be made without departing from the spirit and the scope of the invention. In the above example, a negative resist is used. Where a positive resist is employed, if most of the substrate is illuminated with an electron beam, leaving only a small percentage of the thin films, then the deformation of the substrate cannot be neglected. In this case, it is necessary to apply the invention. Also in the above example, patterns are written by an electron beam. The invention is also applicable to the case in which patterns are written by an ion beam.

The method of finding the coefficient of expansion or contraction of the substrate is not limited to the above scheme. The following method is also possible. The deflection of the substrate can be given by $$\delta = \frac{3(1-\nu)\gamma^2 d_t}{E_s \times d_s^2} \times \sigma$$

where $E_s$ is the Young's modulus of the substrate, $d_s$ is the thickness of the substrate, $d_t$ is the thickness of thin films, $\gamma$ is the radius of the substrate, $\nu$ is the Poisson ratio of the substrate, and $\sigma$ is the stress in the deposited thin films. The deflection $\delta$ of the substrate is the distance of the top position of its concave or convex surface of the bent substrate from its original surface. Letting l (=2$\gamma$) be the diameter of the substrate, the amount of expansion or contraction of the substrate is given by $$\Delta l = \frac{4(d_s + d_t)}{2\gamma} \times \delta$$

Therefore, the coefficient of expansion or contraction is given by $$G = \frac{l + \Delta l}{l} = 1 +$$

$$\left[\frac{4(d_s + d_t)}{2\gamma} \times \frac{3(1 - \nu)\gamma^2 d_t}{E_s \times d_s^2} \times \sigma\right]/l =$$

$$1 + \frac{3(d_s + d_t) \cdot (1 - \nu) \cdot d_t \cdot \sigma}{E_s \times d_s^2}$$

It is also possible to theoretically find the coefficient G using the above formula and then to make the above-described compensation, using the found coefficient G.

Figure 4A:
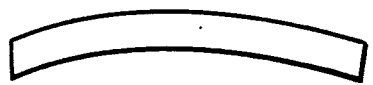
FIGS. 4(a)–4(b) illustrate the manner in which a substrate bends before a thin film is formed on it.
Figure 4B:
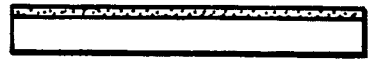

Also in the above example, the substrate is planar before the thin films are deposited on it. The substrate is bent when the films are deposited. The invention can also be applied to a material whose substrate is bent as shown in FIG. 4(a) before a thin film is deposited on it and becomes flat as shown in FIG. 4(b) when the film is removed. After writing and development, the substrate is restored to the original, bent condition shown in FIG. 4(a). In this case, the amount of expansion or contraction $\Delta l$ is negative. Consequently, the compensated interval between the written pattern lines is wider than the interval between the original pattern lines.

As can be understood from the description made thus far, in one embodiment of the invention, the amount of deformation of the substrate caused by the removal of the thin films is forecasted. The positions at which a charged-particle beam strikes the resist are corrected according to the forecasted amount of deformation. After patterns are written on the material with the charged-particle beam, the thin films are selectively removed. As a result, the patterns can be created with improved accuracy.

In another embodiment of the invention, the amount of deformation is calculated from the ratio of the area of the written portion to the area of the substrate. This means that the amount of compensation is adjusted according to the area of the written portion. Hence, the compensation can be made easily and accurately.

In a further embodiment of the invention, the amount of deformation of the substrate caused by the deposition of each individual thin film is found. The total amount of deformation of the substrate is calculated by summing up the amounts of deformation due to the actually deposited thin films. It is not necessary to measure the amount of expansion or contraction each time the kinds of the thin films deposited on the substrate vary. Rather, the compensation can be made simply by calculating the amount of compensation.

Having thus described my invention with the detail and particularity required by the Patent Laws, what is claimed and desired to be protected by Letters Patent is set forth in the following claims.

What is claimed is:

1. A method of mask writing with a charged-particle beam and selective removal of thin films from a substrate, comprising the steps of:
    (a) depositing one or more thin films on a substrate;
    (b) applying a resist sensitive to the charged-particle beam to the thin films;
    (c) calculating an amount of expansion or contraction of a surface of the substrate caused by selective removal of the thin films;
    (d) writing desired patterns on the resist with the charged-particle beam; and
    (e) then selectively removing unwanted portions of the thin films according to the written patterns;
    said step (d) being carried out while correcting positions at which the charged-particle beam hits the resist, according to the calculated amount of expansion or contraction of the surface of the substrate caused by selective removal of the thin films.

2. The method of claim 1, wherein said step of calculating the expansion or contraction of the surface of the substrate consists of calculating the amount of expansion or contraction from a ratio of the area of the written patterns to the area of the substrate.

3. The method of claim 1, wherein said step of calculating the expansion or contraction of the surface of the substrate consists of finding the amount of expansion or contraction of the surface of the substrate caused by the deposition of each individual thin film on the substrate and adding up the amount of expansion or contraction of the substrate due to all the thin films to calculate the amount of expansion or contraction of the substrate.

* * * * *

UNITED STATES PATENT AND TRADEMARK OFFICE
CERTIFICATE OF CORRECTION

PATENT NO. : 5,141,830
DATED : August 25, 1992
INVENTOR(S) : Tadashi Komagata It is certified that error appears in the above-identified patent and that said Letters Patent is hereby corrected as shown below:

Cover Page after [73] Assignee: "Jeol" should read --JEOL--.

and insert "[30] Foreign Application Priority Data Sep. 20, 1989 [JP] Japan ... 1-243937" and "Related U.S. Application Data [63] This is a continuation of copending application(s) Ser. No. 07/584,722 filed on Sep. 18, 1990, now abandoned."

Column 1 Line 3 after "METHOD" delete --"-- and begin new paragraph with --This--.

Column 2 Line 67 after "11" insert --,--.

Signed and Sealed this

Twenty-first Day of September, 1993

Attest:

BRUCE LEHMAN

Attesting Officer    Commissioner of Patents and Trademarks